United States Patent
Sun et al.

(10) Patent No.: US 9,288,776 B2
(45) Date of Patent: Mar. 15, 2016

(54) APPARATUS AND METHOD OF WIDEBAND AUTOMATIC GAIN CONTROL ALGORITHM SUPPORTING MULTIPLE CARRIERS WITH POSSIBLY DIFFERENT AIR INTERFACE TECHNOLOGIES

(71) Applicant: QUALCOMM Incorporated, San Diego, CA (US)

(72) Inventors: Jing Sun, San Diego, CA (US); Amit Mahajan, San Diego, CA (US); Rashid Ahmed Akbar Attar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 145 days.

(21) Appl. No.: 14/072,680

(22) Filed: Nov. 5, 2013

(65) Prior Publication Data

US 2015/0124710 A1 May 7, 2015

(51) Int. Cl.
*H04W 52/52* (2009.01)
*H04L 27/00* (2006.01)
*H03G 3/30* (2006.01)

(52) U.S. Cl.
CPC .............. *H04W 52/52* (2013.01); *H03G 3/3068* (2013.01); *H03G 3/3078* (2013.01); *H04L 27/0008* (2013.01)

(58) Field of Classification Search
None
See application file for complete search history.

(56) References Cited

U.S. PATENT DOCUMENTS

| | | | |
|---|---|---|---|
| 7,120,208 B1 | 10/2006 | Nayler | |
| 7,830,991 B2 | 11/2010 | Dishman et al. | |
| 8,000,302 B2 | 8/2011 | Filipovic | |
| 8,103,234 B2* | 1/2012 | Razzell | H03G 3/001 375/345 |
| 8,295,371 B2 | 10/2012 | Rick et al. | |
| 8,451,962 B2 | 5/2013 | Belogolovy et al. | |
| 2003/0109276 A1 | 6/2003 | Wilson | |
| 2006/0264191 A1 | 11/2006 | Lai | |
| 2008/0070534 A1 | 3/2008 | Lai | |
| 2008/0188195 A1* | 8/2008 | Shi | H03F 1/32 455/232.1 |
| 2008/0268798 A1 | 10/2008 | Lai et al. | |
| 2010/0046679 A1* | 2/2010 | Kajakine et al. | 375/345 |
| 2010/0248665 A1* | 9/2010 | Jonsson et al. | 455/140 |
| 2011/0274223 A1* | 11/2011 | Agarwal et al. | 375/345 |
| 2013/0195215 A1* | 8/2013 | Manglani | H04B 17/318 375/295 |
| 2013/0324065 A1* | 12/2013 | Qin et al. | 455/234.1 |

OTHER PUBLICATIONS

International Search Report and Written Opinion—PCT/US2014/063513—ISA/EPO—Feb. 5, 2015.

* cited by examiner

*Primary Examiner* — Habte Mered
(74) *Attorney, Agent, or Firm* — Loza & Loza LLP (57) ABSTRACT

One or more aspects of the disclosure provide an improved receiver automatic gain control (RxAGC) algorithm operable at a wireless receiver that is capable of receiving transmissions at two or more carrier frequencies utilizing a shared radio frequency (RF) front end architecture, whether in the same radio technology or in different radio technologies. The RxAGC algorithm is utilized to control the gain of amplifiers within the receive chain. Other aspects, embodiments, and features are also claimed and described.

29 Claims, 9 Drawing Sheets

APPARATUS AND METHOD OF WIDEBAND AUTOMATIC GAIN CONTROL ALGORITHM SUPPORTING MULTIPLE CARRIERS WITH POSSIBLY DIFFERENT AIR INTERFACE TECHNOLOGIES

TECHNICAL FIELD

Aspects of the present disclosure relate generally to wireless communication systems, and more particularly, to a wideband receiver with automatic gain control for supporting multiple carriers with possibly different air interface technologies in a single wideband receiver chain.

BACKGROUND

A modern mobile device may have a modem that can support multiple air interface technologies, such as cdma2000 1× and/or EV-DO (both defined by the standards body 3rd Generation Partnership Project 2 (3GPP2)); UMTS and/or LTE (both defined by the standards body 3rd Generation Partnership Project (3GPP)), and/or others. Further, many modern modems are configured to receive transmissions at two or more carrier frequencies, whether in the same radio technology or in different radio technologies. Sometimes, it is desirable to receive signals from two different technologies (or carrier frequencies) at the same time (e.g., to enable simultaneous voice and data). Typically, one receive chain is used for each technology/carrier. However, this presents an expense that could be reduced if a single receive chain were enabled to receive multiple such carriers. Additionally, reduction in the number of receive chains could reduce power consumption and extend battery life at the mobile device.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a receiver for wireless communication. The receiver includes a wideband chain configured to receive a plurality of signals and apply an analog gain to a wideband signal including the received signals. The receiver further includes a plurality of narrowband chains configured to receive a plurality of narrowband signals, respectively, of the wideband signal, wherein each of the narrowband chains is configured to apply a digital gain to a corresponding one of the narrowband signals. The receiver further includes an automatic gain controller (AGC) configured to dynamically adjust the analog gain and the digital gains in accordance with a wideband energy estimate and a plurality of narrowband energy estimates. The wideband energy estimate corresponds to the energy of the received signals, and the plurality of narrowband energy estimates correspond to the energy of the narrowband signals.

Another aspect of the disclosure provides a method of receiving signals operable at a receiver. The receiver receives a plurality of signals with a wideband chain and applying an analog gain to a wideband signal including the received signals. The receiver further receives a plurality of narrowband signals with a plurality of narrowband chains, respectively, of the wideband signal. The receiver further applies a respective digital gain to each of the narrowband signals. The receiver further performs an automatic gain control (AGC) algorithm to dynamically adjust the analog gain and the digital gains in accordance with a wideband energy estimate and a plurality of narrowband energy estimates. The wideband energy estimate corresponds to the energy of the received signals, and the plurality of narrowband energy estimates correspond to the energy of the narrowband signals.

Another aspect of the disclosure provides a receiver for receiving wireless communication signals. The receiver includes a wideband means for receiving a plurality of signals and applying an analog gain to a wideband signal including the received signals. The receiver further includes a plurality of narrowband means configured to receive a plurality of narrowband signals, respective, of the wideband signal, wherein each of the narrowband means is configured to apply a digital gain to a corresponding one of the narrowband signals. The receiver further includes an automatic gain control (AGC) means for dynamically adjusting the analog gain and the digital gains in accordance with a wideband energy estimate and a plurality of narrowband energy estimates. The wideband energy estimate corresponds to the energy of the received signals, and the plurality of narrowband energy estimates correspond to the energy of the narrowband signals.

Another aspect of the disclosure provides an apparatus for wireless communication including at least one processor, a memory coupled to the at least one processor, and a transceiver coupled to the at least one processor. The transceiver includes a wideband chain configured to receive a plurality of signals and apply an analog gain to a wideband signal including the received signals. The transceiver further includes a plurality of narrowband chains configured to receive a plurality of narrowband signals, respectively, of the wideband signal, wherein each of the narrowband chains is configured to apply a digital gain to a corresponding one of the narrowband signals. The transceiver further includes an automatic gain controller (AGC) configured to dynamically adjust the analog gain and the digital gains in accordance with a wideband energy estimate and a plurality of narrowband energy estimates. The wideband energy estimate corresponds to the energy of the received signals, and the plurality of narrowband energy estimates correspond to the energy of the narrowband signals.

Another aspect of the disclosure provides a computer program product including a computer-readable storage medium. The computer-readable storage medium includes code for causing a receiver to perform various functionalities. The code causes the receiver to receive a plurality of signals with a wideband chain and applying an analog gain to a wideband signal including the received signals. The code further causes the receiver to receive a plurality of narrowband signals with a plurality of narrowband chains, respectively, of the wideband signal. The code further causes the receiver to apply, using each of the narrowband chains, a digital gain to a corresponding one of the narrowband signals. The code further causes the receiver to perform an automatic gain control (AGC) algorithm to dynamically adjust the analog gain and the digital gains in accordance with a wideband energy estimate and a plurality of narrowband energy estimates. The wideband energy estimate corresponds to the energy of the received signals, and the plurality of narrowband energy estimates correspond to the energy of the narrowband signals.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

One or more aspects of the disclosure relate to an improved RxAGC algorithm. Here, RxAGC refers to an automatic gain control (AGC) determination at a receiver (Rx) of a mobile device operable in various wireless communication networks. The RxAGC algorithm is utilized to control the gain of amplifiers within the receive chain of the mobile device. The RxAGC algorithm described herein utilizes a shared radio frequency (RF) front end architecture.

Figure 1:
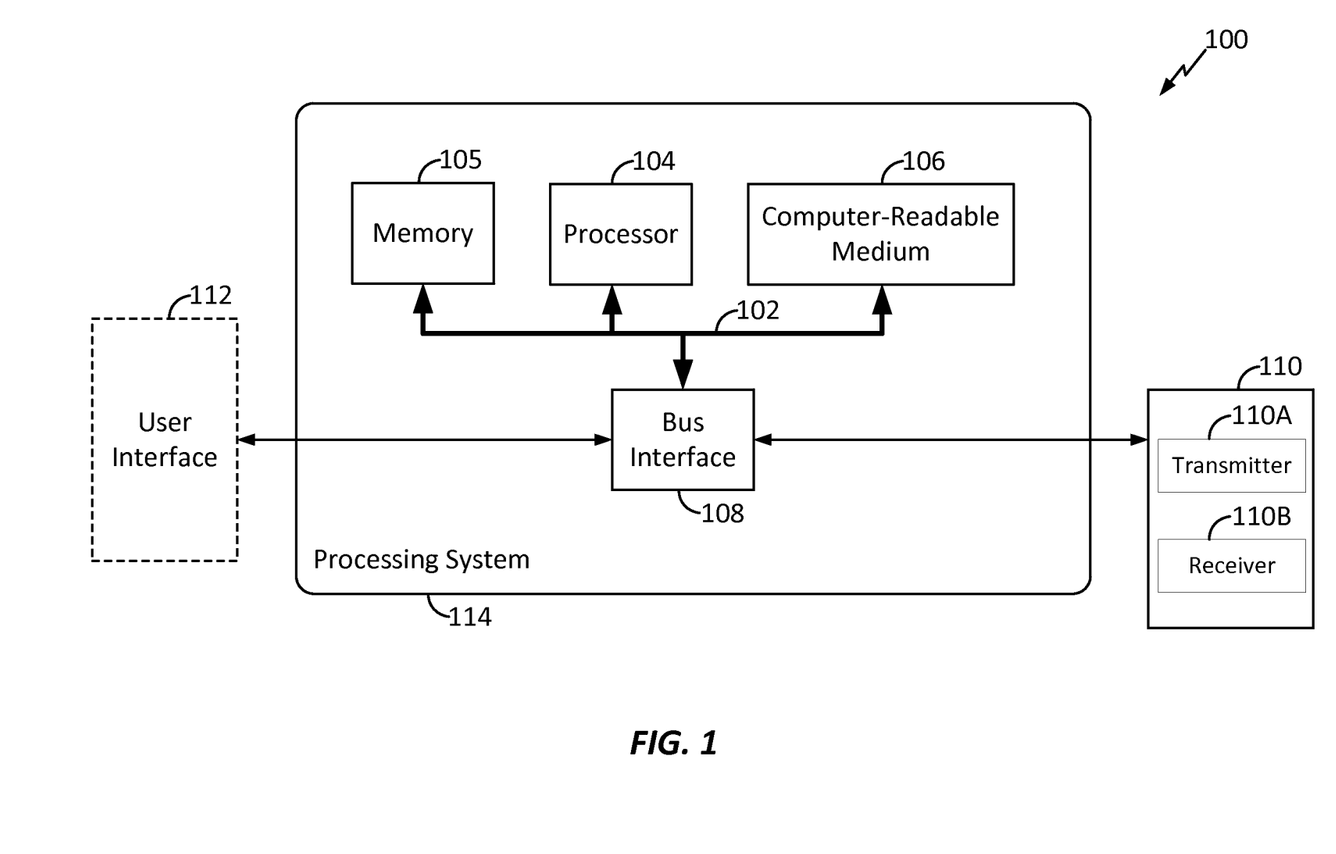
FIG. 1 is a block diagram illustrating an example of a hardware implementation for an apparatus employing a processing system.

FIG. 1 is a conceptual diagram illustrating an example of a hardware implementation for an apparatus 100 employing a processing system 114. In accordance with various aspects of the disclosure, an element, or any portion of an element, or any combination of elements may be implemented with a processing system 114 that includes one or more processors 104. For example, the apparatus 100 may be a user equipment (UE) as illustrated in whole or in part in any one or more of FIGS. 2 and/or 4. Examples of processors 104 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. That is, the processor 104, as utilized in an apparatus 100, may be used to implement any one or more of the processes described below and illustrated in FIGS. 5-8.

In this example, the processing system 114 may be implemented with a bus architecture, represented generally by the bus 102. The bus 102 may include any number of interconnecting buses and bridges depending on the specific application of the processing system 114 and the overall design constraints. The bus 102 links together various circuits including one or more processors (represented generally by the processor 104), a memory 105, and computer-readable media (represented generally by the computer-readable medium 106). The bus 102 may also link various other circuits such as timing sources, peripherals, voltage regulators, and power management circuits, which are well known in the art, and therefore, will not be described any further. A bus interface 108 provides an interface between the bus 102 and a transceiver 110. The transceiver 110 provides a means for communicating with various other apparatus over a transmission medium. The transceiver 110 may include a transmitter 110A and a receiver 110B. The transmitter 110A and receiver 110B may be separate components or combined as one component. In an aspect of the disclosure, the transmitter 110 is configured to as a modem. Depending upon the nature of the apparatus, a user interface 112 (e.g., keypad, touchscreen, touchpad, display, speaker, microphone, joystick) may also be provided.

The processor 104 is responsible for managing the bus 102 and general processing, including the execution of software stored on the computer-readable medium 106. The software, when executed by the processor 104, causes the processing system 114 to perform the various functions described infra for any particular apparatus. The computer-readable medium 106 may also be used for storing data that is manipulated by the processor 104 when executing software.

One or more processors 104 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 106. The computer-readable medium 106 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium 106 may reside in the processing system 114, external to the processing system 114, or distributed across multiple entities including the processing system 114. The computer-readable medium 106 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

For some communication network deployments, the carriers of different technologies are not very far apart in the spectrum, and can be covered by a common receive chain (antenna, filter, LNA, etc). This can help to reduce the cost of the mobile device. For example, such a design has been used for SVDO (simultaneous voice and EV-DO, which enables a voice call utilizing 1× simultaneous to a data session utilizing EV-DO), where the front end of the receive chain is shared between 1× and DO, and the signals are split with rotators into different narrow bands for further filtering, digitally amplified, and other processing.

Figure 2:
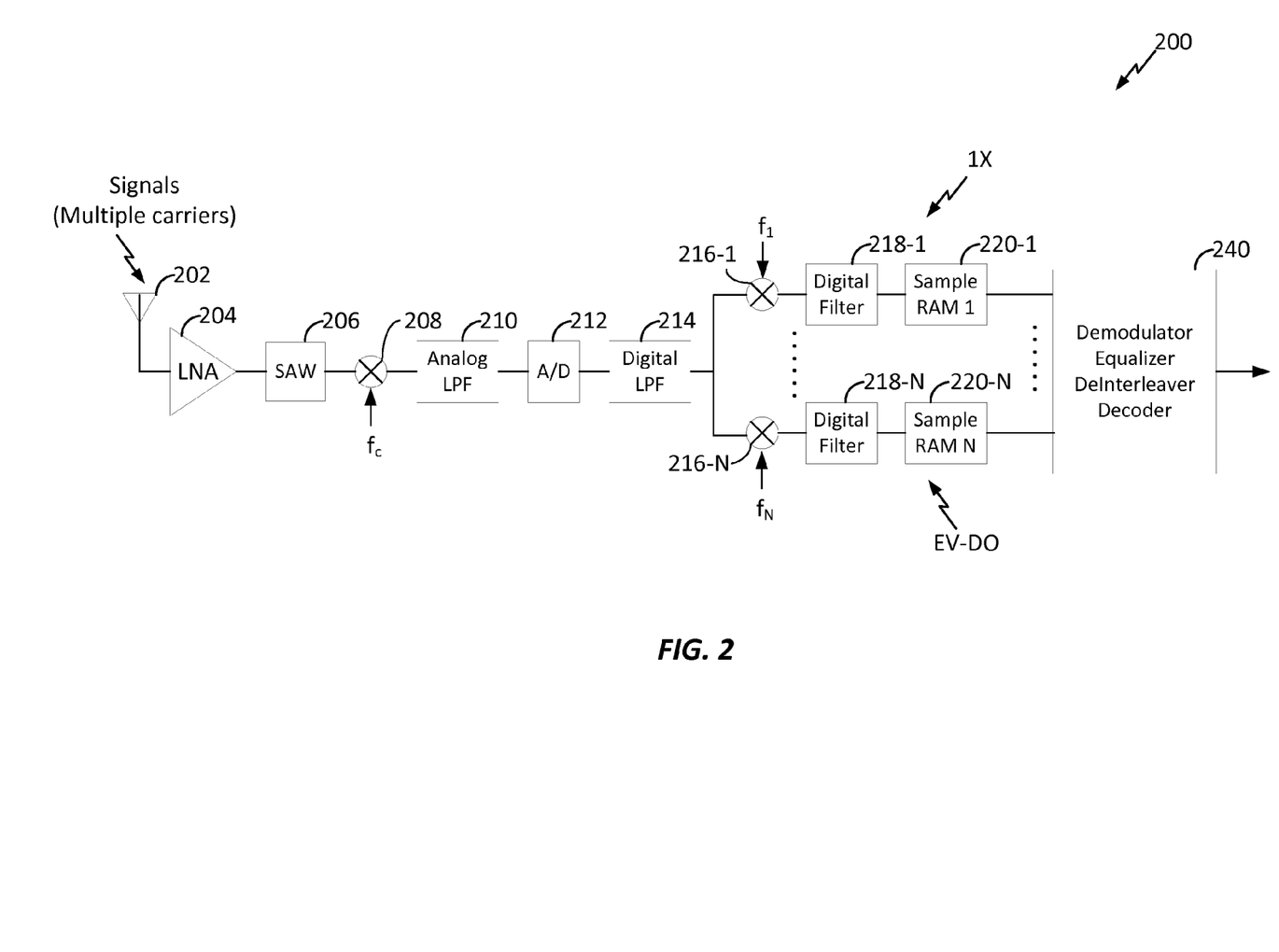
FIG. 2 is a conceptual block diagram illustrating a single front end for a receiver configured for single band multiple carriers operation.

FIG. 2 is a conceptual block diagram illustrating a single front end for a receiver 200 that can be utilized for single band multiple carriers operation (e.g., single-band SVDO). As shown in FIG. 2, a number of signals corresponding to different communication carriers may be received by a single antenna 202. Following the antenna, the received signals pass through an analog low noise amplifier (LNA) 204. After being filtered by a surface acoustic wave (SAW) filter 206 and downconverted by a downcoverter 208, the analog signals are filtered by an analog low pass filter (LPF) and converted to a digital domain signal with an analog-to-digital converter (A/D) 212. The digital domain signal is further filtered with a digital LPF 214. Next, a number of digital frequency rotators 216 (216-1 to 216-N) are utilized to rotate the carrier to the respective communication carriers (e.g., one 1× carrier, and one EV-DO carrier). For each carrier, a filter 218 (218-1 to 218-N) may be used to remove undesired signals. The respective digital samples may then be downsampled and stored in memory 220 (220-1 to 220-N) for further processing 240 (e.g., demodulation, equalization, deinterleaving, turbo decoding, etc.).

Embodiments of the technology discussed in this disclosure may include multiple receive chains for receiving wireless signals. For example, in FIG. 2, the portion of the architecture before the rotators 216 may be considered a "wideband" chain (as the LNA amplifies all received frequencies). And the portion after the rotators 216 may be considered "narrowband" chains (as separate amplification/processing may be performed for each carrier). Here, a single wideband chain covers multiple carriers for many the technologies (e.g., 1× and EV-DO), while multiple narrowband chains may enable differentiated coverage of each carrier. Each of the carriers may be used for a corresponding communication channel.

Figure 3:
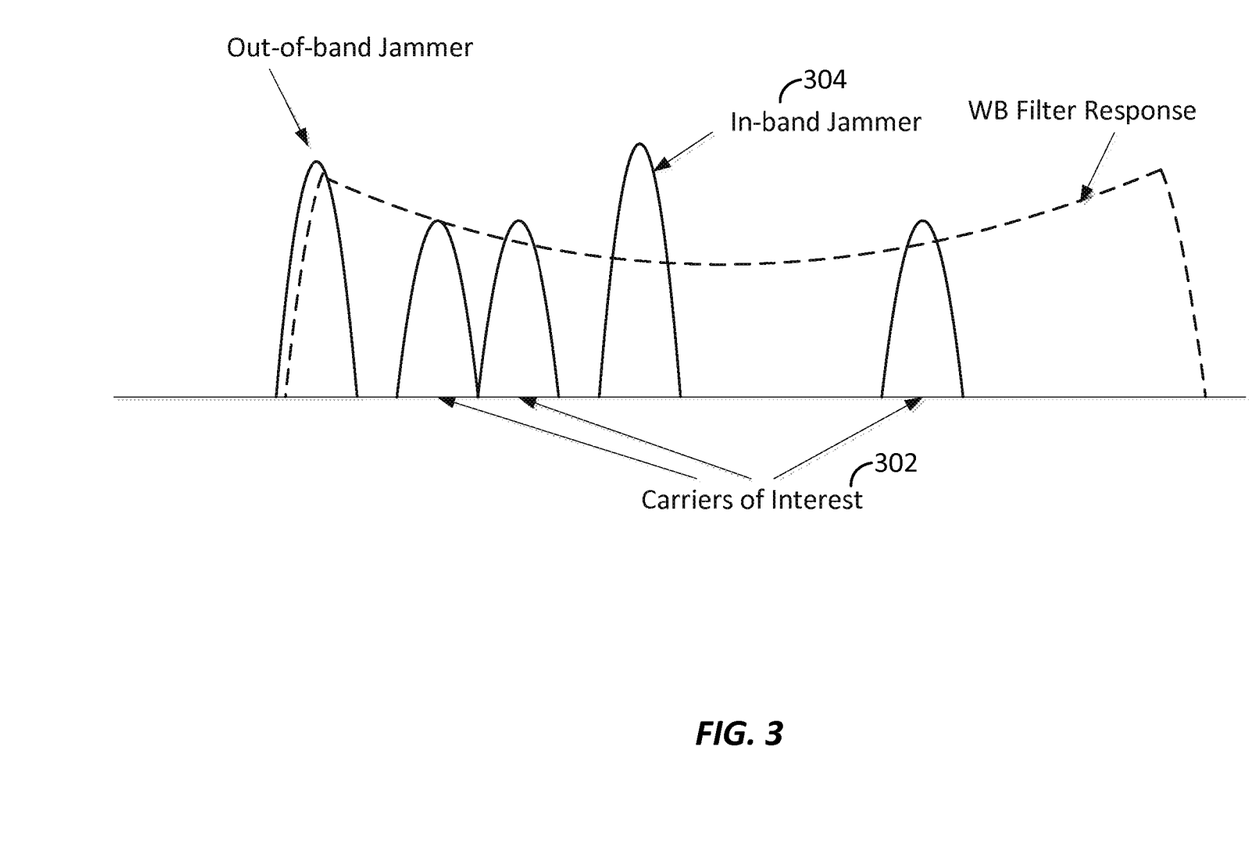
FIG. 3 is a conceptual diagram illustrating a number of carriers in a wideband spectrum.

Here, because the wideband chain may cover more spectrum than the narrow bands that may be of interest, its amplification and processing may include unintended signals. For example, FIG. 3 is a conceptual diagram illustrating a number of narrowband carriers in a wideband spectrum. Here, the unintended signals may be some other carrier(s) between the carriers of interest 302, and may be an in-band jammer 304.

Typically, filters are not designed sharply enough to filter out such an in-band jammer. Moreover, the narrowband chain generally cannot detect such in-band jammers, which would be filtered out by the filters in the narrowband chain. Thus, when the wideband chain amplifier (i.e., the LNA 204) amplifies the entire received signal, such in-band jammers may cause the amplified signal to saturate, resulting in performance degradation or even dropped calls.

Furthermore, because the base stations from which each carrier are transmitted may not be co-located, they may be at different distances from the mobile device. Therefore, even if the two base stations are transmitting their respective carriers at the same power, the received power at the mobile device (receiver 200) may be significantly different for their respective carriers from the two base stations. Moreover, if a strong signal is being transmitted very nearby a relatively weak signal, it may be possible that the weaker signal is overwhelmed by the stronger signal, e.g., through RF effects such as residual side band (RSB). Thus, when receiving a plurality of such carriers with a single receive chain, the mobile device may need to fall back to reduced functionality, such as dropping one or more of the carriers.

Figure 4:
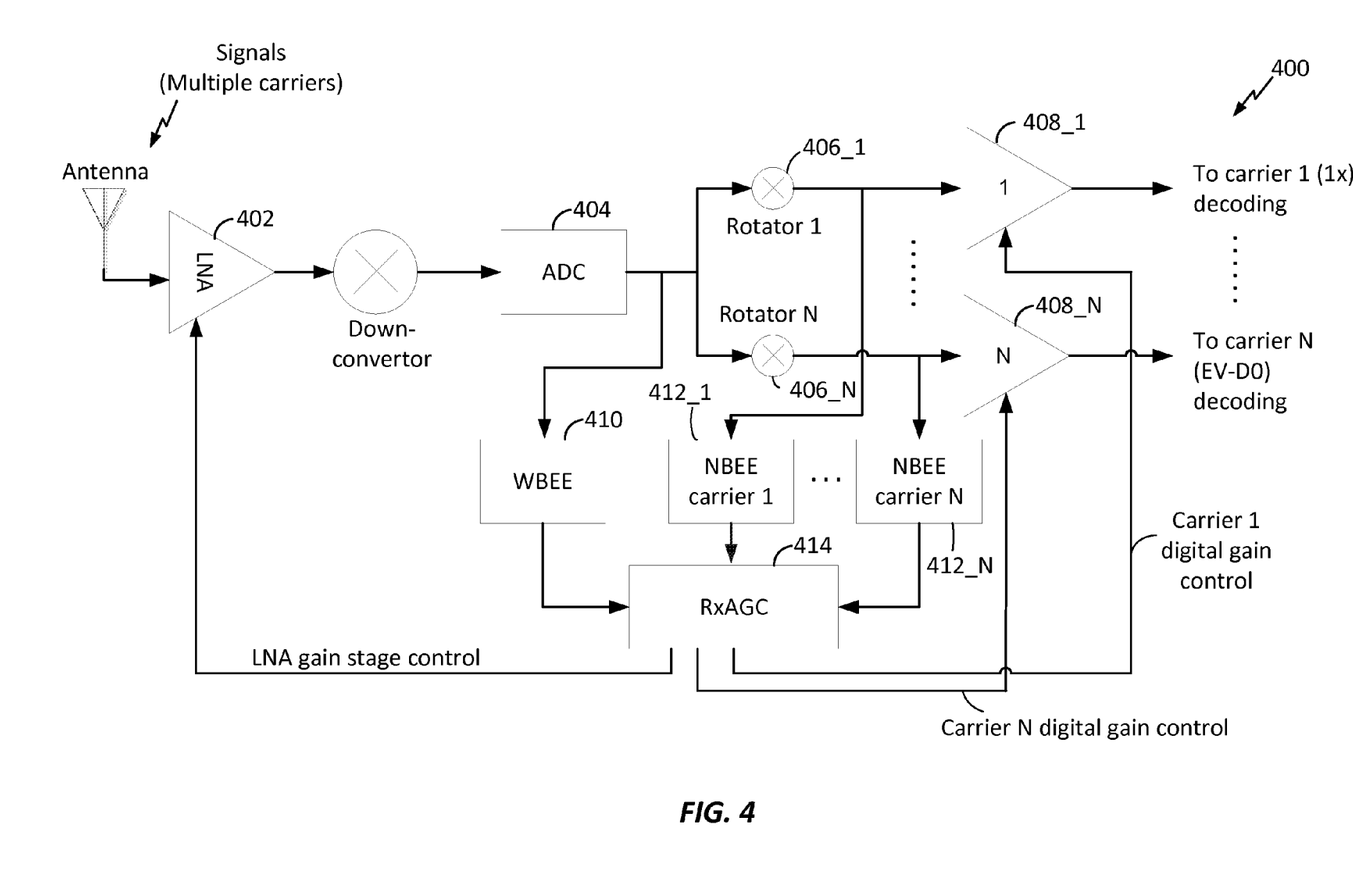
FIG. 4 is a conceptual block diagram illustrating a receiver configured to perform a receiver automatic gain control (Rx-AGC) algorithm according to an aspect of the present disclosure.

FIG. 4 is a simplified block diagram illustrating a receiver 400 configured to perform an RxAGC algorithm according to some aspects of the present disclosure. This receiver architecture may be implemented using the receiver 200. In this illustration, for simplicity the filter blocks are not shown in FIG. 4. The RxAGC algorithm is utilized to control the gain of amplifiers within the receive chain. After the antenna, an LNA 402 amplifies the received signals by a controllable amount (analog gain). Typically, the LNA is implemented with multiple stages, such that the number of stages to use can be adapted to achieve the desired analog gain. After the LNA, to facilitate processing and demodulation of the data, the received signals may be downconverted to baseband and converted to a digital domain signal by an analog-to-digital converter (ADC) 404. Then, a number (N) of frequency rotators 406 (e.g., 406_1, 406_2 ... 406_N) convert the digital domain signal to a number of narrowband signals corresponding to respective carriers. Here, the signal path before the rotators 406 is referred to as a wideband chain, and the signal paths that reside after the rotators are referred to as the narrowband chains. The wideband chain receives the signals and applies the analog gain to the signals, collectively. Each of the narrowband chains includes a controllable digital gain 408 (e.g., 408_1, 408_2 ... 408_N) (referred to as narrowband digital amplifiers in this disclosure) to apply a gain to its narrowband signal. The narrowband chains may be used for different carriers of the same or different radio access technologies. By way of example and not limitation, one narrowband chain including the gain 408_1 may be used to handle a 1× signal, and another narrowband chain including the gain 408_N may be used to handle an EV-DO signal.

The total gain in the receive chain for a particular carrier is the product of the analog LNA gain (wideband gain) and the digital gain (narrowband gain). As the mobile device moves about in a cellular network, the over-the-air the signal strength or channel conditions can vary greatly. For example, the distance between the mobile device and a base station can greatly affect the signal strength. Thus, the receiver needs to have the ability to adapt to this changing environment. In various aspects of the disclosure, the wideband gain at the analog LNA stage (e.g., LNA 402) and the narrowband gains in the digital domain, are properly distributed so that there is little or no saturation at any stage in the receiver, and the signal-to-noise ratio (SNR) can be as high as possible.

The RxAGC algorithm controls the gain distribution between the analog and digital components (e.g., LNA 402 and digital gains 408). Because of the imbalanced nature of the cellular network, the power level of signals from different base stations received at the mobile device may vary greatly. Accordingly, the gain distribution at the receiver needs to be synchronized, in the sense that there is only one LNA gain to control among all carriers. In various aspects of the disclosure, the RxAGC algorithm selects a single, suitable LNA gain value for all received carriers and suitable digital gains for the narrowband chains. Here, the gains for the narrowband chains may be independently controlled. In this way, saturation at any point in the signal path may be reduced or avoided. In addition, the RxAGC algorithm provides finer control of the combined wideband and narrowband gains.

Still referring to FIG. 4, the RxAGC algorithm takes as input parameters a wideband energy estimation (WBEE), as well as a narrowband energy estimation (NBEE) for each carrier. The WBEE may be determined by a wideband energy estimator 410, and each NBEE may be determined by a narrowband energy estimator 412 for each carrier (e.g., 412_1 to 412_N). Accordingly, the RxAGC algorithm computes an analog gain for the LNA 402, as well as digital gains for each digital gain 408. The WBEE may correspond to a measurement of the energy (or, in some examples, the power) of the received wideband signal, after the analog-to-digital conversion. With this measurement, wideband saturation can be detected (i.e., any clipping or saturation resulting from the gain at the LNA being too high). The NBEE may correspond to a measurement of the energy (or, in some examples, the power) of the narrowband signal, after narrowband filtering. In various examples, the NBEE can be determined at the input or the output of the digital gain 408 for a respective carrier. In various aspects of the disclosure, the WBEE and the NBEE may be implemented utilizing any suitable hardware, software, or combination of the two, utilizing sampling or measuring circuitry and/or algorithms that would be well-known to one of ordinary skill in the art.

Furthermore, the LNA 402 may include a plurality of gain stages. Here, the RxAGC algorithm can utilize knowledge of characteristics of the LNA gain stages, e.g., the gain of each stage, and the noise figure resulting from the use of each gain stage, as a factor in its computation of the gains to apply to the wideband chain and/or the narrowband chains. The exact gain values of the LNA 402 are device dependent and frequency dependent, and in some examples, may be determined in a calibration process. Still further, the RxAGC algorithm may utilize other knowledge from the design phase of the mobile device. For example, the knowledge may include: gains of all of the digital components in the Rx chains; the dynamic range of the ADC; the dynamic range of the WBEE and NBEE measurements, etc. If the signal is too high or too low, the WBEE or NBEE may saturate on the high or low ends.

Because the wideband chain including the LNA 402 is shared across all the narrowband chains, a single decision may be made for the gain of the LNA 402, and a single measurement by the WBEE 410 for the wideband chain may be made at each measurement interval. In general, it is undesirable for different narrowband chains in the wideband coverage to control the LNA 402 separately. Moreover, it is undesirable for different narrowband chains to measure the wideband energy, as these measurements may interrupt one another. Thus, in various aspects of the present disclosure, a shared RxAGC controller 414 is utilized, at least for the wideband chain including the LNA 402. The RxAGC controller 414 (referred to herein as the automatic gain controller) may be used to perform the RxAGC algorithm described herein based on the estimated WBEE and NBEEs. The RxAGC controller 414 is operatively coupled to the wideband energy estimator 410 and narrowband energy estimators 412. Further, the RxAGC controller 414 provides an LNA gain stage control signal to control the LNA 402 and a number of digital gain control signals to control the digital gains 408. Here, the digital gains 408 for the narrowband chains may be separately controlled, after a common decision is made on the wideband chain (e.g., gain of LNA 402).

The operation of the RxAGC algorithm may be characterized below in two sets of rules: one for the wideband chain, and another for the narrowband chains. By utilizing these rules, and the illustrated receiver architecture in FIG. 4, a receiver having a single receive chain may be effectively utilized to receive two or more carriers, even in different technologies, and even if the different carriers are transmitted from different, non-co-located base stations.

Figure 5:
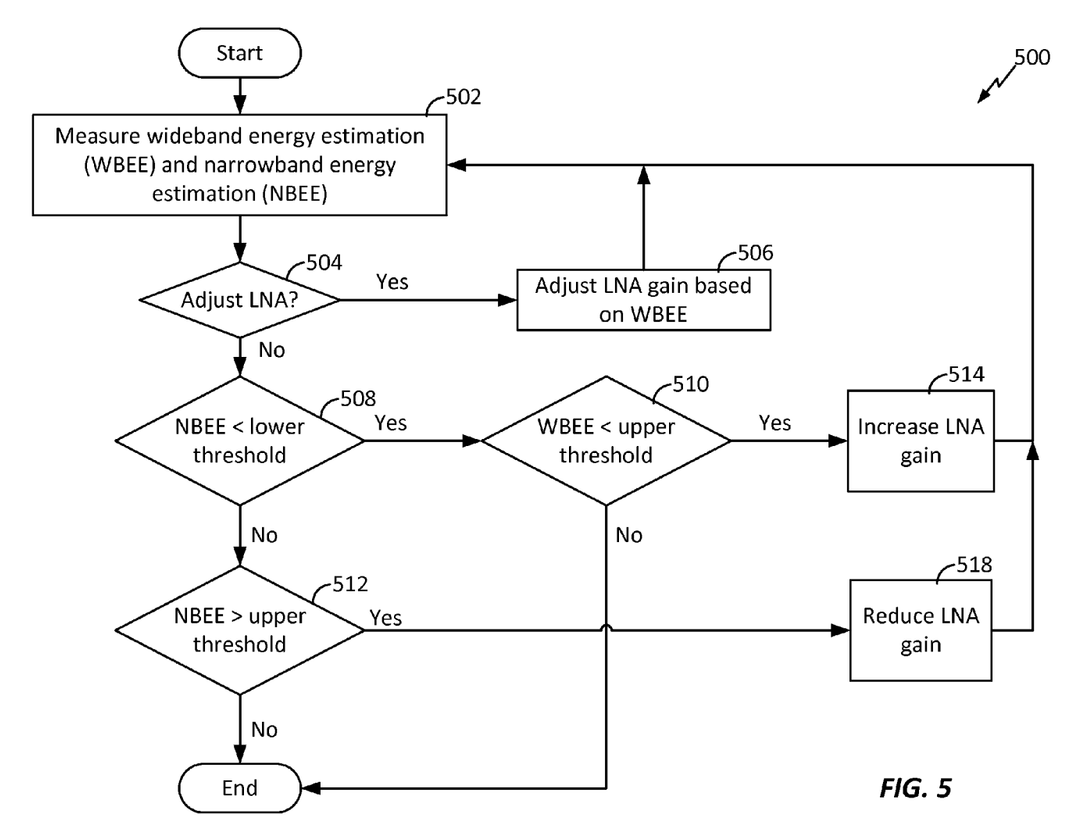
FIGS. 5 and 6 are flow charts illustrating an RxAGC algorithm in accordance with some embodiments.
Figure 6:
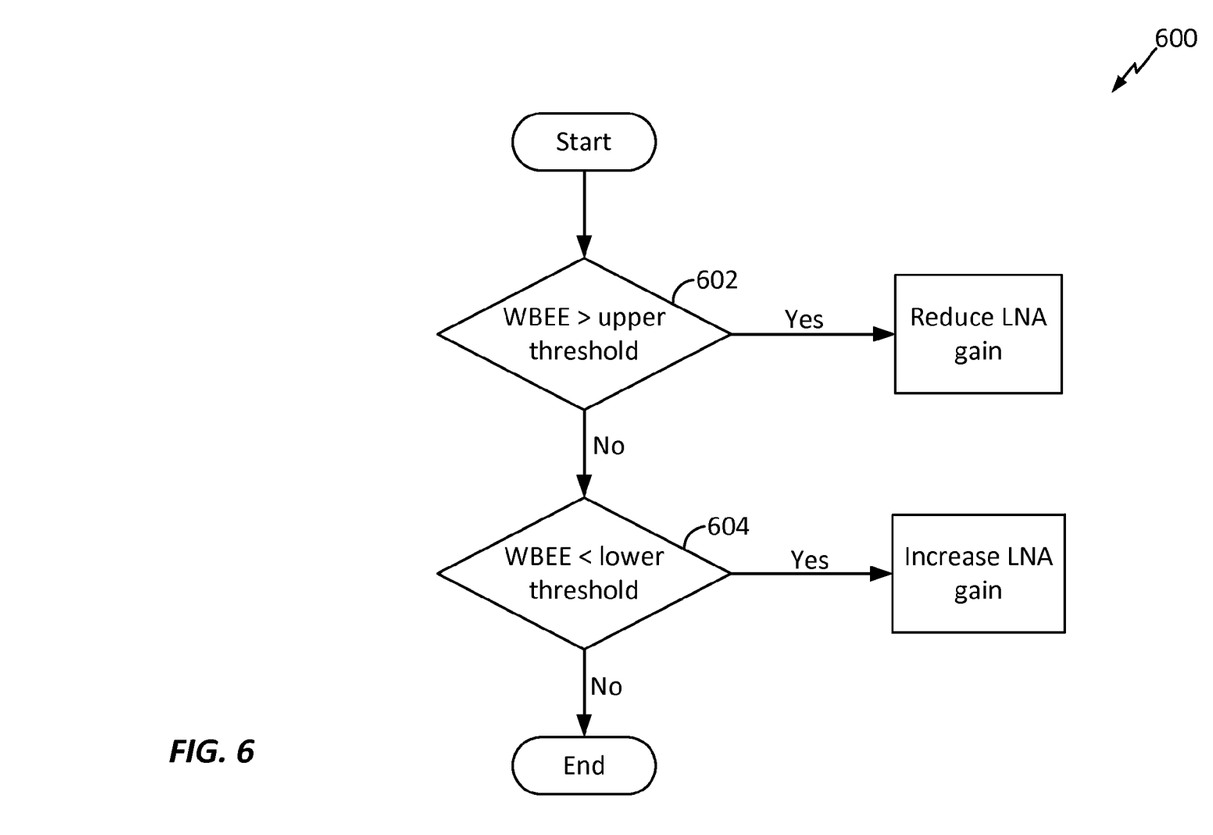

FIGS. 5 and 6 are flow charts illustrating an RxAGC algorithm 600 in accordance with an aspect of the disclosure. For example, the RxAGC algorithm 600 may be implemented with a receiver 400. The RxAGC algorithm 600 can dynamically adjust the analog gain and the digital gains of the receiver 400 in accordance with a wideband energy estimate and a plurality of narrowband energy estimates. It is assumed that the receiver 400 receives a number of signals (a wideband signal) through an antenna and an LNA 402. (See FIG. 4). In step 502, a wideband energy estimation (WBEE) and a number of narrowband energy estimations (NBEEs) are measured. For example, the WBEE may be measured by a wideband energy estimator 410, and the NBEEs may be measured by a number of narrowband energy estimators 412, respectively. In step 504, it is determined whether or not to adjust the gain of the LNA 402 based on the measured WBEE. In an aspect of the disclosure, the measured WBEE is converted to a value named WBEEdBVrms (in dBVrms units), and each measured NBEE is converted to a value named RxAGCdBVrms (in dBVrms unit).

If the WBEEdBVrms is not in a suitable range, the LNA gain may be adjusted in step 506. In an aspect of the disclosure, if WBEEdBVrms is not within a suitable range, the gain of the LNA may be adjusted. The suitable range may be implementation- and air interface-dependent. For the upper bound (or threshold), it can depend on the peak-to-average-power ratio of the mixed signal input and the up fading budget. In one example, the upper threshold may be −10 dB. For the lower bound (or threshold), in some implementations, there may be a flooring effect, such that if the signal level is too low, the WBEE reading can be dominated by noise and cannot follow the input signal level lower. However, in some other implementations that do not have this flooring effect, a suitable WBEE lower bound (e.g., −45 dB) may be used to control the LNA gain.

FIG. 6 is a flow chart illustrating a process 600 for adjusting LNA gain based on WBEE in accordance with an aspect of the disclosure. The process 600 may be performed in the step 506. In step 602, if the WBEE is greater than an upper threshold or saturation threshold (e.g., WBPEdBVrms>−10 dB), the LNA gain is reduced. For example, the RxAGC controller 414 may be configured to output a suitable LNA gain stage control signal to reduce the gain of the LNA 402. In step 604, if the WBEE is less than a lower threshold or floor (e.g., WBPEdBVrms<−45 dB), the LNA gain is increased. For example, the RxAGC controller 414 may be configured to output a suitable LNA gain stage control signal to increase the gain of the LNA 402. In various aspects of the disclosure, the LNA 402 may have a number of stages, and the LNA gain can be adjusted by switching among the stages based on the LNA gain stage control signal.

Referring back to FIG. 5, in step 508, if it is determined that a minimum value of the measured NBEEs is less than a lower threshold, the RxAGC algorithm continues to step 510; otherwise, the algorithm continues to step 512. In an aspect of the disclosure, if the minimum NBEE is less than a lower threshold or a floor (e.g., RxAGCdBVrms<−87 dB), the algorithm 500 continues to step 510. In step 510, if it is determined that the WBEE will still be less than the upper threshold after an LNA gain increase (e.g., WBPEdBVrms<−10 dB), the LNA gain is increased in step 514. The determination of step 510 is possible because the exact LNA gain change that will be introduced if the LNA gain is increased by one or more stages is known.

In step 512, if any NBEE is greater than an upper threshold, the algorithm continues to step 518 to reduce the LNA gain. The upper threshold of the NBEE may be determined by an algorithm based on SNR and power saving considerations. If the NBEE is desirably high, it can be assumed that the SNR is sufficiently high and higher NBEE will not provide more benefits (e.g., the SNR is capped, or the SNR reaches the point the peak data rate can be achieved). Accordingly, the LNA gain can be reduced in step 518 to save power at the LNA. In general, a lower LNA gain uses less current and provides a lower SNR. The algorithm 500 may go through multiple iterations until a certain LNA gain is determined that will provide the desired WBEE and NBEEs. The algorithm 500 may be repeated whenever any of the digital gains (e.g., digital gains 408) of the narrowband chains are adjusted.

Figure 7:
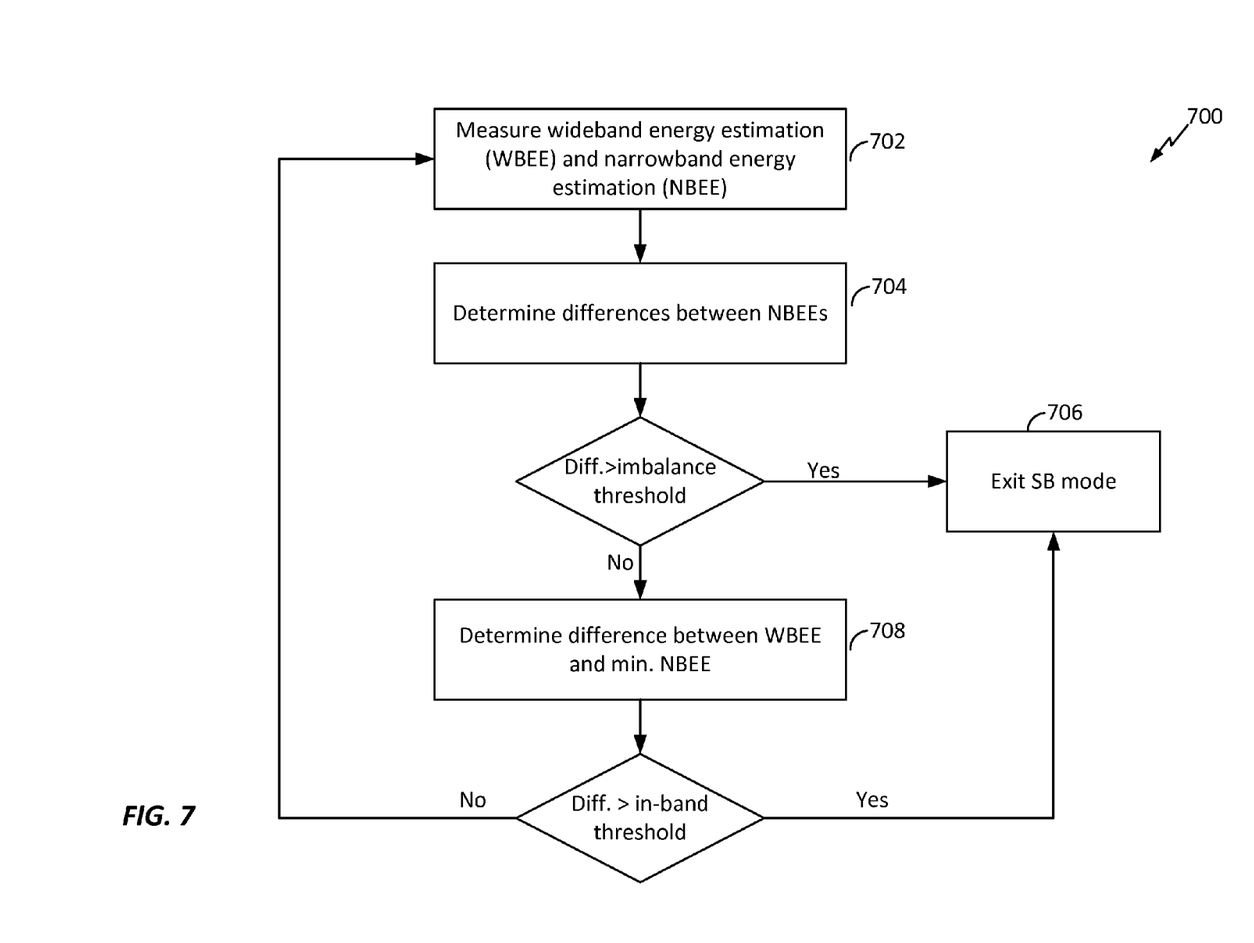
FIG. 7 is a flow chart illustrating an algorithm for configuring a receiver to exit a multi-carrier single band mode in accordance with some embodiments.

FIG. 7 is a flow chart illustrating an algorithm 700 for configuring a receiver to exit a multi-carrier single band mode (SB mode) in accordance with an aspect of the disclosure. The algorithm 700 may be performed at the receiver 400. In the SB mode, the receiver 400 is configured to receive a number of signals corresponding to different carriers (e.g., carriers of interest 302 in FIG. 3) through a common wideband chain and process the received signals in the digital domain by a number of narrowband chains. In step 702, the receiver 400 measures the WBEE and NBEEs of the signals. This step may be the same as the step 502 in FIG. 5. In step 704, differences between the NBEEs of different carriers are determined. In an aspect of the disclosure, if the difference between any two RxAGCdBVrms is larger than an imbalance threshold (e.g., 14 dB), it may indicate an imbalance among the carriers, and the receiver may accordingly exit the SB mode in step 706 and process the narrowband signals one carrier at a time. In step 708, a difference between WBEE and the minimum NBEE are determined. In an aspect of the disclosure, if the difference between the WBPEdBVrms and the minimum RxAGCdBVrms is greater than a suitable in-band jammer threshold, it may indicate the existence of a strong in-band jammer signal, and the receiver may accordingly exit the SB mode in step 706 and process the narrowband signals one carrier at a time. In other words, the receiver may utilize the wideband chain and only one of the narrowband chains when it is not in the SB mode.

Figure 8:
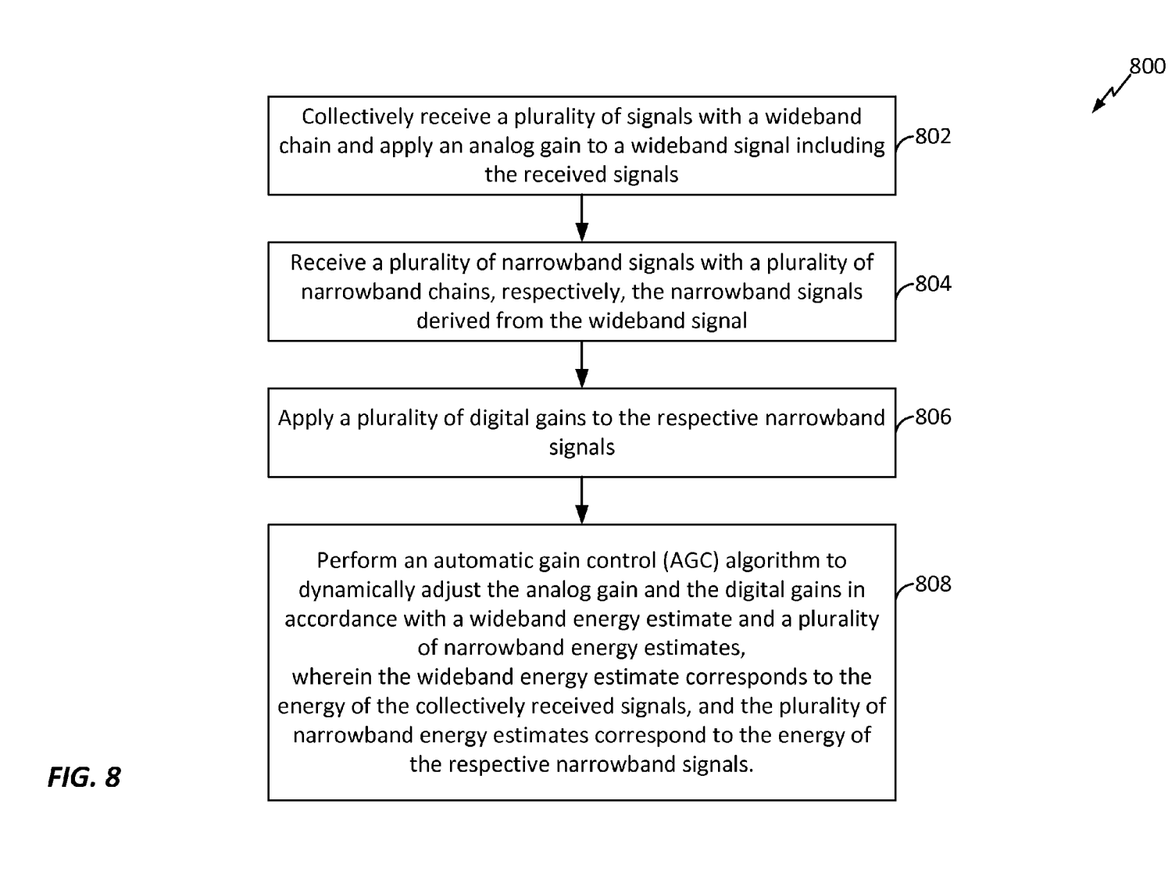
FIG. 8 is a flow chart illustrating a method of automatic gain control operable at a receiver in accordance with some embodiments.

FIG. 8 is a flow chart illustrating a method 800 of automatic gain control operable at a receiver in accordance with an aspect of the disclosure. For example, the method 800 can be performed at the receiver 400 or any suitable receiver. In step 802, a receiver 400 collectively receives a plurality of signals with a wideband chain and applies an analog gain to a wideband signal including the received signals. In step 804, the receiver receives a plurality of narrowband signals with a plurality of narrowband chains, respectively. The narrowband signals may be derived from the wideband signal, e.g., may be narrowband portions of the wideband signal. In step 806, the receiver applies a digital gain to a corresponding one of the narrowband signals. In step 808, the receiver performs an automatic gain control (AGC) algorithm to dynamically adjust the analog gain and the digital gains in accordance with a wideband energy estimate and a plurality of narrowband energy estimates. The wideband energy estimate may correspond to the energy of the collectively received signals in a digital domain, and the plurality of narrowband energy estimates may correspond to the energy of the respective narrowband signals. By way of example and not limitation, the wideband chain may include the LNA 402 and ADC 404, and the narrowband chains may include the digital gains 408. In some aspects of the disclosure, the RxAGC controller 414, the wideband energy estimator 410, and the narrowband energy estimators 412 may be utilized to perform the AGC algorithm of the method 800.

Figure 9:
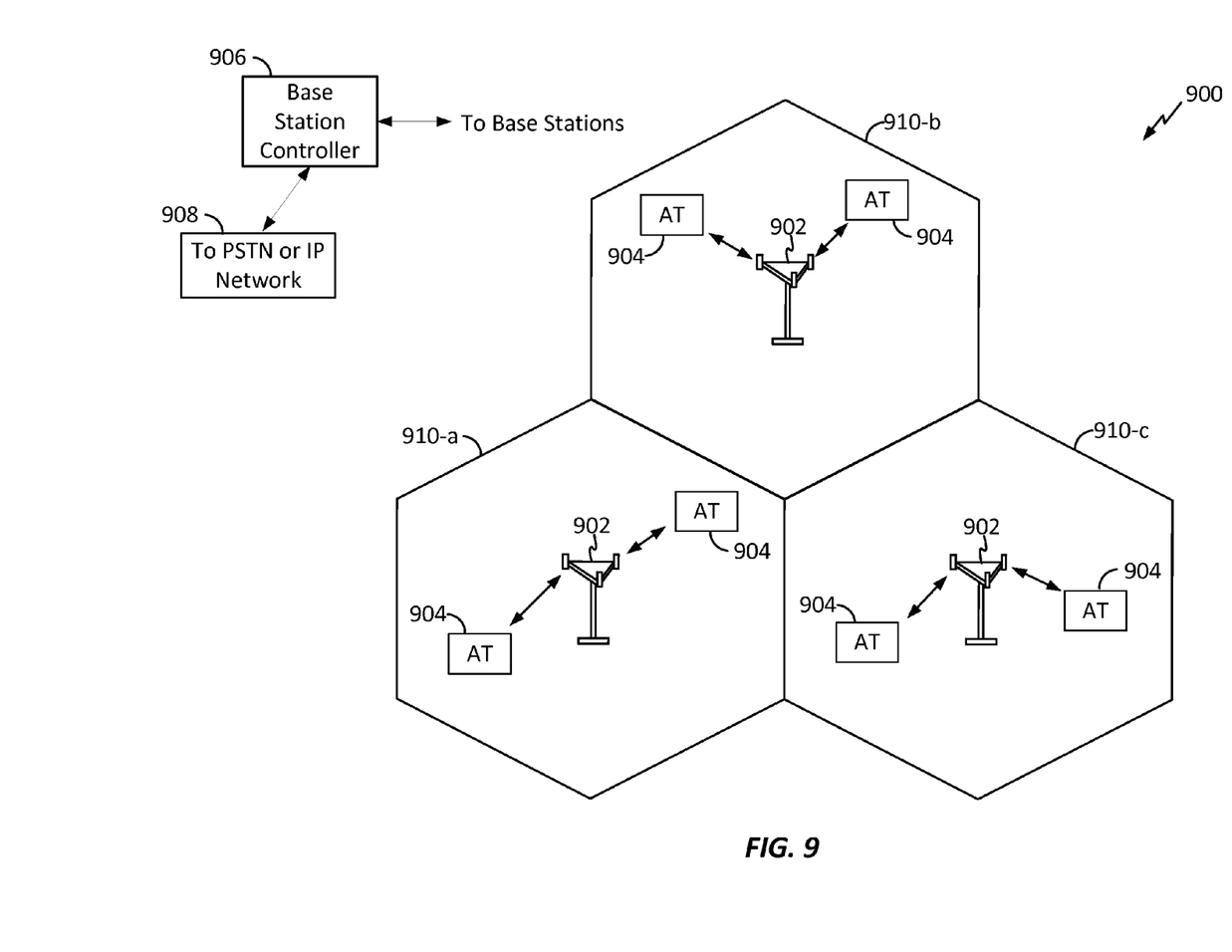
FIG. 9 is a block diagram illustrating an example of a network environment in which one or more aspects of the present disclosure may find application.

FIG. 9 is a block diagram illustrating an example of a network environment in which one or more aspects of the present disclosure may find application. The wireless communication system 900 generally includes one or more base stations 902, one or more access terminals 904, one or more base station controllers (BSC) 906, and a core network 908 providing access to a public switched telephone network (PSTN) (e.g., via a mobile switching center/visitor location register (MSC/VLR)) and/or to an IP network (e.g., via a packet data switching node (PDSN)). Any of the access terminals 904 may be implemented with the apparatus 100 including a receiver similar to those shown in FIGS. 2 and 4. The system 900 may support operation on multiple carriers (waveform signals of different frequencies). Multi-carrier transmitters can transmit modulated signals simultaneously or concurrently on the multiple carriers. Each modulated signal may be a CDMA signal, a TDMA signal, an OFDMA signal, a Single Carrier Frequency Division Multiple Access (SC-FDMA) signal, etc. Each modulated signal may be sent on a different carrier and may carry control information (e.g., pilot signals), overhead information, data, etc. In various aspects of the disclosure, the multiple carriers may include 1× and EV-DO carriers such as those illustrated in FIGS. 2 and 4.

The base stations 902 can wirelessly communicate with the access terminals 904 via a base station antenna. The base stations 902 may each be implemented generally as a device adapted to facilitate wireless connectivity (for one or more access terminals 904) to the wireless communications system 900. A base station 902 may also be referred to by those skilled in the art as an access point, a base transceiver station (BTS), a radio base station, a radio transceiver, a transceiver function, a basic service set (BSS), an extended service set (ESS), a Node B, a femto cell, a pico cell, and/or some other suitable terminology.

The base stations 902 are configured to communicate with the access terminals 904 under the control of the base station controller 906 via one or more carriers. Each of the base stations 902 can provide communication coverage for a respective geographic area. The coverage area 910 for each base station 902 here is identified as cells 910-a, 910-b, or 910-c. The coverage area 910 for a base station 902 may be divided into sectors (not shown, but making up only a portion of the coverage area). In a coverage area 910 that is divided into sectors, the multiple sectors within a coverage area 910 can be formed by groups of antennas with each antenna responsible for communication with one or more access terminals 904 in a portion of the cell.

One or more access terminals 904 may be dispersed throughout the coverage areas 910, and may wirelessly communicate with one or more sectors associated with each respective base station 902. An access terminal 904 may generally include one or more devices that communicate with one or more other devices through wireless signals. Such access terminals 904 may also be referred to by those skilled in the art as a user equipment (UE), a mobile station (MS), a subscriber station, a mobile unit, a subscriber unit, a wireless unit, a remote unit, a mobile device, a wireless device, a wireless communications device, a remote device, a mobile subscriber station, a mobile terminal, a wireless terminal, a remote terminal, a handset, a terminal, a user agent, a mobile client, a client, or some other suitable terminology. The access terminals 904 may include mobile terminals and/or at least substantially fixed terminals. Examples of access terminals 104 include mobile phones, pagers, wireless modems, personal digital assistants, personal information managers (PIMs), personal media players, palmtop computers, laptop computers, tablet computers, televisions, appliances, e-readers, digital video recorders (DVRs), machine-to-machine (M2M) devices, and/or other communication/computing devices which communicate, at least partially, through a wireless or cellular network.

Several aspects of a wideband automatic gain control algorithm supporting multiple carriers and a receiver including the same have been presented with reference to 1× and EV-DO carriers. As those skilled in the art will readily appreciate, various aspects described throughout this disclosure may be extended to other telecommunication systems, network architectures and communication standards.

By way of example, various aspects may be extended to UMTS systems such as W-CDMA, TD-SCDMA and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

We claim:

1. A receiver for wireless communication, comprising:
a wideband chain configured to receive a wideband signal and apply an analog gain to the wideband signal;
a plurality of narrowband chains, in a multi-carrier single band mode (SB mode), configured to receive a plurality of narrowband signals, respectively, of the wideband signal, wherein each of the narrowband chains is configured to apply a digital gain to a corresponding one of the narrowband signals; and
an automatic gain controller (AGC) configured to dynamically adjust the analog gain and the digital gains in accordance with a wideband energy estimate and a plurality of narrowband energy estimates, wherein the wideband energy estimate corresponds to the energy of the received signals, and the plurality of narrowband energy estimates correspond to the energy of the narrowband signals,
wherein the AGC is further configured to:
in the SB mode,
determine an in-band difference between the wideband energy estimate and a minimum value of the narrowband energy estimates;
if a minimum value of the narrowband energy estimates is less than a floor, increase the analog gain;
if any of the narrowband energy estimates is greater than an upper threshold, decrease the analog gain; and
if the in-band difference is greater than an in-band jammer threshold, exit the SB mode and utilize the wideband chain and one of the narrowband chains to receive a corresponding one of the narrowband signals.

2. The receiver of claim 1,
wherein the wideband chain comprises at least one of a low noise amplifier or an analog-to-digital converter, and
wherein the low noise amplifier is configured to apply the analog gain to the received signals, and the analog-to-digital converter is configured to convert the received signals to a digital domain signal.

3. The receiver of claim 2, further comprising a plurality of rotators for splitting the digital domain signal into the plurality of narrowband signals corresponding to respective communication carriers.

4. The receiver of claim 1, wherein the AGC is further configured to adjust the analog gain such that the wideband energy estimate is less than a saturation threshold.

5. The receiver of claim 1, wherein the plurality of narrowband chains comprise a plurality of narrowband digital amplifiers for applying the digital gains to the respective narrowband signals.

6. The receiver of claim 1, wherein the AGC is further configured to:
determine a first difference between the narrowband energy estimates; and if the first difference is greater than an imbalance threshold, the wideband chain and the plurality of narrowband chains are configured to process the plurality of narrowband signals one carrier at a time.

7. The receiver of claim 1, wherein the corresponding one of the narrowband signals comprises only one of the narrowband signals.

8. A method of receiving signals operable at a receiver, comprising:
   receiving a wideband signal with a wideband chain and applying an analog gain to the wideband signal;
   receiving, in a multi-carrier single band mode (SB mode), a plurality of narrowband signals with a plurality of narrowband chains, respectively, of the wideband signal;
   applying a respective digital gain to each of the narrowband signals;
   performing an automatic gain control (AGC) algorithm to dynamically adjust the analog gain and the digital gains in accordance with a wideband energy estimate and a plurality of narrowband energy estimates, wherein the wideband energy estimate corresponds to the energy of the received signals, and the plurality of narrowband energy estimates correspond to the energy of the narrowband signals,
   wherein the AGC algorithm comprises:
      in the SB mode,
         determining an in-band difference between the wideband energy estimate and a minimum value of the narrowband energy estimates;
         if a minimum value of the narrowband energy estimates is less than a floor, increasing the analog gain;
         if any of the narrowband energy estimates is greater than an upper threshold, decreasing the analog gain; and
         if the in-band difference is greater than an in-band jammer threshold, exiting the SB mode and utilizing the wideband chain and one of the narrowband chains to receive a corresponding one of the narrowband signals.

9. The method of claim 8, further comprising at least one of:
   applying the analog gain to the received signals by utilizing a low noise amplifier of the wideband chain; or
   converting the received signals to a digital domain signal by utilizing an analog-to-digital converter.

10. The method of claim 9, further comprising splitting the digital domain signal into the plurality of narrowband signals corresponding to respective communication carriers.

11. The method of claim 8, wherein performing an AGC algorithm comprises adjusting the analog gain such that the wideband energy estimate is less than a saturation threshold.

12. The method of claim 8, further comprising applying the digital gains to the respective narrowband signals by utilizing a plurality of narrowband digital amplifiers of the narrowband chains.

13. The method of claim 8, wherein performing the AGC algorithm comprises:
   determining a first difference between the narrowband energy estimates; and
   if the first difference is greater than an imbalance threshold, processing the plurality of narrowband signals one carrier at a time.

14. The method of claim 8, wherein the corresponding one of the narrowband signals comprises only one of the narrowband signals.

15. A receiver for receiving wireless communication signals, comprising:
   a wideband means for receiving a wideband signal and applying an analog gain to the wideband signal;
   a plurality of narrowband means, in a multi-carrier single band mode (SB mode), configured to receive a plurality of narrowband signals, respective, of the wideband signal, wherein each of the narrowband means is configured to apply a digital gain to a corresponding one of the narrowband signals; and
   an automatic gain control (AGC) means for dynamically adjusting the analog gain and the digital gains in accordance with a wideband energy estimate and a plurality of narrowband energy estimates, wherein the wideband energy estimate corresponds to the energy of the received signals, and the plurality of narrowband energy estimates correspond to the energy of the narrowband signals,
   wherein the AGC means is configured to:
      in the SB mode,
         determine an in-band difference between the narrowband energy estimates;
         if a minimum value of the narrowband energy estimates is less than a floor, increase the analog gain;
         if any of the narrowband energy estimates is greater than an upper threshold, decrease the analog gain; and
         if the in-band difference is greater than an in-band jammer threshold, exit the SB mode and utilize the wideband means and one of the narrowband means to receive a corresponding one of the narrowband signals.

16. The receiver of claim 15,
   wherein the wideband means comprises at least one of a low noise amplifier or an analog-to-digital converter, and
   wherein the low noise amplifier is configured to apply the analog gain to the received signals, and the analog-to-digital converter is configured to convert the received signals to a digital domain signal.

17. The receiver of claim 16, further comprising a plurality of rotating means for splitting the digital domain signal into the plurality of narrowband signals corresponding to respective communication carriers.

18. The receiver of claim 15, wherein the AGC means comprises:
   means for adjusting the analog gain such that the wideband energy estimate is less than a saturation threshold.

19. The receiver of claim 15, wherein the plurality of narrowband means comprise a plurality of narrowband digital amplifiers for applying the digital gains to the respective narrowband signals.

20. The receiver of claim 15, wherein the AGC means is configured to:
   determine a first difference between the narrowband energy estimates; and
   if the first difference is greater than an imbalance threshold, the wideband means and the plurality of narrowband means are configured to process the plurality of narrowband signals one carrier at a time.

21. The receiver of claim 15, wherein the corresponding one of the narrowband signals comprises only one of the narrowband signals.

22. An apparatus for wireless communication comprising:
   at least one processor;
   a memory coupled to the at least one processor; and
   a transceiver coupled to the at least one processor, wherein the transceiver comprises:
a wideband chain configured to receive a wideband signal and apply an analog gain to the wideband signal;
a plurality of narrowband chains, in a multi-carrier single band mode (SB mode), configured to receive a plurality of narrowband signals, respectively, of the wideband signal, wherein each of the narrowband chains is configured to apply a digital gain to a corresponding one of the narrowband signals; and
an automatic gain controller (AGC) configured to dynamically adjust the analog gain and the digital gains in accordance with a wideband energy estimate and a plurality of narrowband energy estimates, wherein the wideband energy estimate corresponds to the energy of the received signals, and the plurality of narrowband energy estimates correspond to the energy of the narrowband signals,
wherein the AGC is further configured to:
in the SB mode,
determine an in-band difference between the wideband energy estimate and a minimum value of the narrowband energy estimates;
if a minimum value of the narrowband energy estimates is less than a floor, increase the analog gain;
if any of the narrowband energy estimates is greater than an upper threshold, decrease the analog gain; and
if the in-band difference is greater than an in-band jammer threshold, exit the SB mode and utilize the wideband chain and one of the narrowband chains to receive a corresponding one of the narrowband signals.

23. The apparatus of claim 22,
wherein the wideband chain comprises at least one of a low noise amplifier or an analog-to-digital converter, and
wherein the low noise amplifier is configured to apply the analog gain to the received signals, and the analog-to-digital converter is configured to convert the received signals to a digital domain signal.

24. The apparatus of claim 23, wherein the transceiver further comprises a plurality of rotators for splitting the digital domain signal into the plurality of narrowband signals corresponding to respective communication carriers.

25. The apparatus of claim 22, wherein the AGC is further configured to adjust the analog gain such that the wideband energy estimate is less than a saturation threshold.

26. The apparatus of claim 22, wherein the plurality of narrowband chains comprise a plurality of narrowband digital amplifiers for applying the digital gains to the respective narrowband signals.

27. The apparatus of claim 22, wherein the AGC is further configured to:
determine a first difference between the narrowband energy estimates; and
if the first difference is greater than an imbalance threshold, the wideband chain and the plurality of narrowband chains are configured to process the plurality of narrowband signals one carrier at a time.

28. The apparatus of claim 22, wherein the corresponding one of the narrowband signals comprises only one of the narrowband signals.

29. A computer program product, comprising:
a non-transitory computer-readable storage medium comprising code for causing a receiver to:
receive a wideband signal with a wideband chain and applying an analog gain to the wideband signal;
receive, in a multi-carrier single band mode (SB mode), a plurality of narrowband signals with a plurality of narrowband chains, respectively, of the wideband signal;
apply, using each of the narrowband chains, a digital gain to a corresponding one of the narrowband signals;
perform an automatic gain control (AGC) algorithm to dynamically adjust the analog gain and the digital gains in accordance with a wideband energy estimate and a plurality of narrowband energy estimates, wherein the wideband energy estimate corresponds to the energy of the received signals, and the plurality of narrowband energy estimates correspond to the energy of the narrowband signals,
wherein the AGC algorithm comprises:
in the SB mode,
determining an in-band difference between the wideband energy estimate and a minimum value of the narrowband energy estimates;
if a minimum value of the narrowband energy estimates is less than a floor, increasing the analog gain;
if any of the narrowband energy estimates is greater than an upper threshold, decreasing the analog gain; and
if the in-band difference is greater than an in-band jammer threshold, exiting the SB mode and utilizing the wideband chain and one of the narrowband chains to receive a corresponding one of the narrowband signals.

* * * * *